(12) United States Patent
Peng et al.

(10) Patent No.: US 11,088,211 B2
(45) Date of Patent: Aug. 10, 2021

(54) DISPLAY SUBSTRATE, MANUFACTURING METHOD THEREOF, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chuan Peng, Beijing (CN); Yan Cui, Beijing (CN); Yu Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 118 days.

(21) Appl. No.: 16/488,580

(22) PCT Filed: Oct. 23, 2018

(86) PCT No.: PCT/CN2018/111439
§ 371 (c)(1),
(2) Date: Aug. 24, 2019

(87) PCT Pub. No.: WO2019/085789
PCT Pub. Date: May 9, 2019

(65) Prior Publication Data
US 2021/0134894 A1    May 6, 2021

(30) Foreign Application Priority Data
Nov. 2, 2017  (CN) .......................... 201711062677.8

(51) Int. Cl.
*H01L 27/32* (2006.01)
*H01L 51/56* (2006.01)

(52) U.S. Cl.
CPC ...... *H01L 27/3218* (2013.01); *H01L 27/3246* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 2015/0053948 A1* | 2/2015 | Matsushima | ....... H01L 27/3218 257/40 |
| 2016/0079323 A1* | 3/2016 | Choi | ................... H01L 27/3246 257/40 |
| 2020/0119113 A1* | 4/2020 | Lee | ....................... H01L 27/322 |

FOREIGN PATENT DOCUMENTS

| | | |
|---|---|---|
| CN | 105336881 A | 2/2016 |
| KR | 20090021580 A | 3/2009 |
| KR | 20090021580 A * | 3/2009 |

OTHER PUBLICATIONS

Machine Translation of KR 2009-0021580 (Year: 2009).*
International Search Report in Application No. PCT/CN2018/111439, dated Jan. 29, 2019.

* cited by examiner

*Primary Examiner* — J. E. Schoenholtz
(74) *Attorney, Agent, or Firm* — Syncoda LLC; Feng Ma

(57) ABSTRACT

A display substrate includes a substrate, a pixel-defining layer configured to define a plurality of sub-pixel regions, and a plurality of sub-pixels having at least two colors, each arranged within each of the plurality of sub-pixel regions. The pixel-defining layer and the plurality of sub-pixels are disposed over the substrate. The pixel-defining layer includes a plurality of first pixel-defining portions and a plurality of second pixel-defining portions. Each of the plurality of first pixel-defining portions is configured to separate neighboring sub-pixels of different colors. Each of the plurality of second pixel-defining portions is configured (Continued)

to separate neighboring sub-pixels of the same color. At least one of the plurality of second pixel-defining portions has a smaller width than any one of the plurality of first pixel-defining portions.

18 Claims, 3 Drawing Sheets

DISPLAY SUBSTRATE, MANUFACTURING METHOD THEREOF, AND DISPLAY APPARATUS

CROSS-REFERENCE TO RELATED APPLICATION

The present application claims priority to Chinese Patent Application No. 201711062677.8 filed on Nov. 2, 2017, the disclosure of which is hereby incorporated by reference in its entirety.

TECHNICAL FIELD

The present disclosure relates generally to the field of display technologies, and more specifically relates to a display substrate, a manufacturing method thereof, and a display apparatus.

BACKGROUND

With the continuous development of the organic light-emitting diode (OLED) technologies, the resolution of an OLED display device is getting constantly elevated, and the density for pixels is also becoming higher and higher.

As such, how to arrange more pixels in a display substrate with limited area and space has become a technical issue that needs to be resolved at the current moment.

SUMMARY

In a first aspect, the present disclosure provides a display substrate.

The display substrate includes a substrate, a pixel-defining layer configured to define a plurality of sub-pixel regions, and a plurality of sub-pixels having at least two colors, each arranged within each of the plurality of sub-pixel regions. The pixel-defining layer and the plurality of sub-pixels are disposed over the substrate.

The pixel-defining layer comprises a plurality of first pixel-defining portions and a plurality of second pixel-defining portions. Each of the plurality of first pixel-defining portions is configured to separate neighboring sub-pixels of different colors. Each of the plurality of second pixel-defining portions is configured to separate neighboring sub-pixels of the same color. It is configured such that at least one of the plurality of second pixel-defining portions has a smaller width than any one of the plurality of first pixel-defining portions.

According to some embodiments of the disclosure, each of the plurality of second pixel-defining portions has a smaller width than each of the plurality of first pixel-defining portions.

Optionally, each of the plurality of first pixel-defining portions has a width of larger than, or substantially equal to, 10 μm, and each of the plurality of second pixel-defining portions has a width having a range of approximately 5-10 μm.

According to some embodiments of the disclosure, each of the plurality of second pixel-defining portions has a smaller height than each of the plurality of first pixel-defining portions.

Optionally, each of the plurality of first pixel-defining portions has a height of larger than, or substantially equal to, 3 μm, and each of the plurality of second pixel-defining portions has a height having a range of approximately 1-3 μm.

According to some embodiments of the disclosure, each of the plurality of second pixel-defining portions has a substantially same height as each of the plurality of first pixel-defining portions.

According to some embodiments of the disclosure, the display substrate is an organic light-emitting diode display substrate.

Optionally, each of any two neighboring sub-pixels having a same color contains a light-emitting layer that is not connected to one another.

Optionally, each of at least two neighboring sub-pixels having a same color contains a light-emitting layer that is connected to one another.

In a second aspect, the present disclosure further provides a method for manufacturing a display substrate.

The method comprises the following steps of:
providing a substrate;
forming a pixel-defining layer comprising a plurality of first pixel-defining portions and a plurality of second pixel-defining portions over the substrate, wherein the pixel-defining layer define a plurality of sub-pixel regions, and at least one of the plurality of second pixel-defining portions has a smaller width than any one of the plurality of first pixel-defining portions; and
forming a plurality of sub-pixels over the substrate, such that each of the plurality of sub-pixels is arranged in in each of the plurality of sub-pixel regions, any two neighboring sub-pixels of different colors are separated by one of the plurality of first pixel-defining portions, and any two neighboring sub-pixels of a same color are separated by one of the plurality of second pixel-defining.

According to some embodiments of the method, in the forming a pixel-defining layer comprising a plurality of first pixel-defining portions and a plurality of second pixel-defining portions over the substrate, each of the plurality of second pixel-defining portions has a smaller width than each of the plurality of first pixel-defining portions.

Optionally, in the forming a pixel-defining layer comprising a plurality of first pixel-defining portions and a plurality of second pixel-defining portions over the substrate, each of the plurality of first pixel-defining portions has a width of larger than, or substantially equal to, 10 μm, and each of the plurality of second pixel-defining portions has a width having a range of approximately 5-10 μm.

Herein, the forming a pixel-defining layer comprising a plurality of first pixel-defining portions and a plurality of second pixel-defining portions over the substrate can comprise:
performing an exposure process utilizing a halftone or gray mask to form the plurality of first pixel-defining portions and the plurality of second pixel-defining portions, such that each of the plurality of second pixel-defining portions has a smaller height than each of the first pixel-defining portion.

Herein, each of the plurality of first pixel-defining portions can have a height of larger than, or substantially equal to, 3 μm, and each of the plurality of second pixel-defining portions can have a height having a range of approximately 1-3 μm.

According to some embodiments of the method, the forming a pixel-defining layer comprising a plurality of first pixel-defining portions and a plurality of second pixel-defining portions over the substrate comprises:
performing an exposure process utilizing a mask to form the plurality of first pixel-defining portions and the plurality of second pixel-defining portions, such that each of the plurality of second pixel-defining portions has a substantially same height than each of the first pixel-defining portion.

According to some embodiments of the method, the forming a plurality of sub-pixels over the substrate comprises:

providing an evaporation deposition mask comprising a plurality of openings, configured such that at least two neighboring sub-pixels of a same color correspond to one of the plurality of openings; and performing an evaporation deposition process utilizing the evaporation deposition mask to form a light-emitting layer, such that the light-emitting layer of each of the at least two neighboring sub-pixels of the same color are connected.

According to some other embodiments of the method, the forming a plurality of sub-pixels over the substrate comprises:

providing an evaporation deposition mask comprising a plurality of openings, configured such that neighboring sub-pixels of a same color correspond to different openings; and performing an evaporation deposition process utilizing the evaporation deposition mask to form a light-emitting layer, such that the light-emitting layer of each of neighboring sub-pixels of a same color are not connected.

Herein, the light-emitting layer can be an organic light-emitting layer.

In a third aspect, the present disclosure further provides a display apparatus, which can include a display substrate based on any one of the embodiments of the display substrate as described above.

Herein, the display substrate can be an organic light-emitting diode display substrate.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

In conventional display apparatuses, if viewed from the structure and manner of pixel arrangement in the display substrate, the pixel-defining layer (PDL) takes up a large space in the display substrates, second only to the sub-pixels. As such, if the space taken up by the pixel-defining layer can be reduced, more space can be spared for arranging more sub-pixels, which can result in an increased density of pixels in the display substrate, in turn leading to a higher resolution for the display apparatus, or alternatively can cause more space to be spared for arranging more driving circuits, leading to an improved driving properties for the display substrate.

In convention display substrates, considering the matching errors associated with the evaporation deposition process as well as the current drainage occurring on the sub-pixel elements, the pixel-defining layer is utilized for non-differentially separating neighboring sub-pixels of different colors, or for separating neighboring sub-pixels of same colors.

However, the neighboring sub-pixels of the same color do not need to be separated by the pixel-defining layer, because there is no need to avoid a mixture of colors for the two neighboring sub-pixels of the same color. Although there might be an interference from lights from one sub-pixel to another sub-pixel next to it, the negative effect it has on the images of the display apparatus is limited. As such, it is possible to reduce the size of the pixel-defining layer between neighboring sub-pixels of the same color such that the space can be spared.

In a first aspect, the present disclosure provides a display substrate.

The display substrate has a reduced size of the pixel-defining layer between neighboring sub-pixels of a same color. Thereby, the space taken up by the pixel-defining layer in the display substrate can be reduced.

Such a feature of reduced size for the pixel-defining layer between neighboring sub-pixels of a same color can result in an increased spare space for arranging more sub-pixels, leading to an increased density of pixels and an elevated resolution. Alternatively, this above feature can result in an increased spare space for arranging more driving circuit elements. For example, the driving circuit can be 8T1C rather than 7T1C. Consequently, the driving performance of the display substrate can be enhanced.

Figure 1:
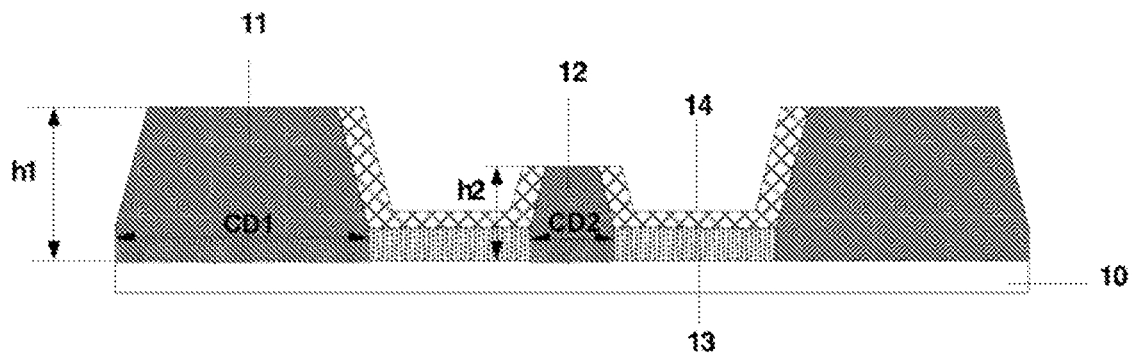
FIG. 1 and FIG. 2 are respectively a cross-sectional view and a top view of a display substrate according to a first embodiment of the present disclosure.
Figure 2:
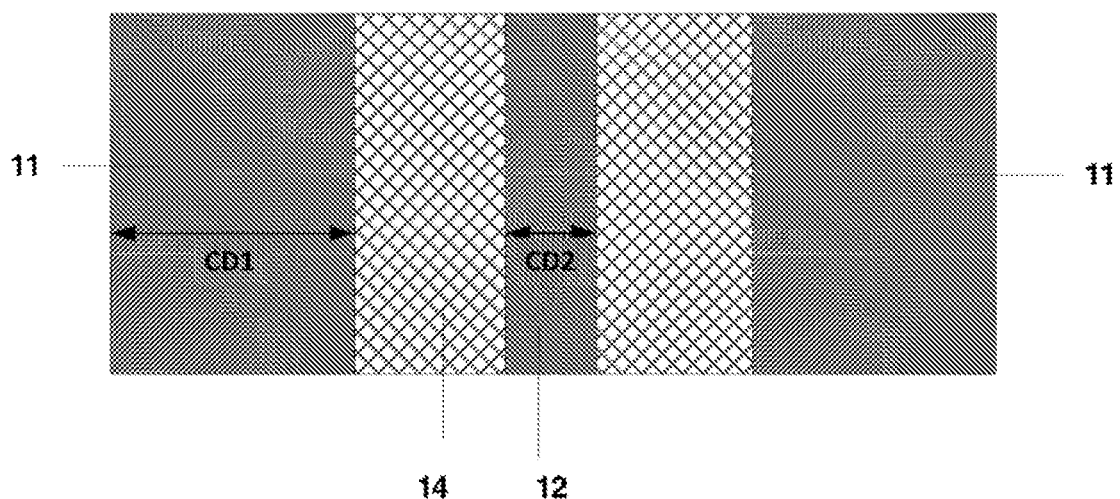

FIG. 1 and FIG. 2 respectively illustrate the cross-sectional view and a top view of a display substrate according to a first embodiment of the disclosure.

As shown in FIGS. 1 and 2, the display substrate includes a substrate 10, and a pixel-defining layer and sub-pixels having N colors disposed over the substrate 10. The pixel-defining layer is configured to define a plurality of sub-pixel regions, and each sub-pixel is arranged within each of the plurality of sub-pixel regions.

The pixel-defining layer comprises a first pixel-defining portion 11 and a second pixel-defining portion 12. The first pixel-defining portion 11 is configured to separate neighboring sub-pixels of different colors, and the second pixel-defining portion 12 is configured to separate neighboring sub-pixels of the same color. Herein N is a positive integer that is higher than 1. It is further configured such that a width of the second pixel-defining portion 12 (CD2) is smaller than a width of the first pixel-defining portion 11 (CD1).

In the above first embodiment of the display substrate, each of the plurality of sub-pixels includes an anode 13, a light-emitting layer 14, and a cathode (not shown in the figures). The color of a sub-pixel is defined as the color of lights emitted by the light-emitting layer 14 in the sub-pixel.

Optionally, the display substrate can include sub-pixels of a red color, a green color, and a blue color. In other words, the plurality of sub-pixels include red sub-pixels (R), green sub-pixels (G), and blue sub-pixels (B). As such, N is equal to 3.

It is noted that in other embodiments of the display substrate, the sub-pixels are not limited to the three primary colors (R, G, and B), and can have other colors. Additionally, N can be a number other than 3.

In the display substrate disclosed herein, a width of the pixel-defining layer is defined as a width between neighboring sub-pixel regions. A width of the second pixel-defining portion 12 (CD2) is smaller than a width of the first pixel-defining portion 11 (CD1) is defined by comparing the width of the second pixel-defining portion 12 (CD2) and the width of the first pixel-defining portion 11 (CD1) in a substantially same direction. For example, in FIG. 1 and FIG. 2, CD1 and CD2 are defined in a direction that is parallel to the substrate 10.

In the embodiment of the display substrate described above, portions of the pixel-defining layer having different widths are configured. Specifically, a first pixel-defining portion 11 having a relatively larger width is configured to separate neighboring sub-pixels of different colors, whereas a second pixel-defining portion 12 having a relatively smaller width is configured to separate neighboring sub-pixels of a same color.

As such, the size of the second pixel-defining portion 12 is reduced, which in turn can reduce the space taken up by the pixel-defining layer in the display substrate, sparing more space for arranging more sub-pixels or for arranging more driving circuit elements.

In the above first embodiment of the display substrate as illustrated in FIG. 1, a height of the second pixel-defining portion 12 (h2) is further configured to be smaller than a height of the first pixel-defining portion 11 (h1). In other words, the second pixel-defining portion 12 has a smaller width and a smaller height than the first pixel-defining portion 11 (i.e. CD2<CD1 and h2<h1).

Figure 3:
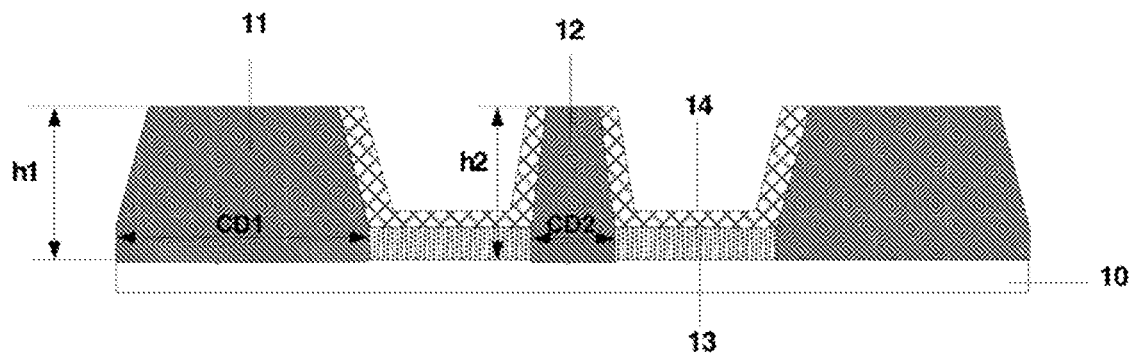
FIG. 3 is a cross-sectional view of a display substrate according to a second embodiment of the present disclosure.
Figure 4:
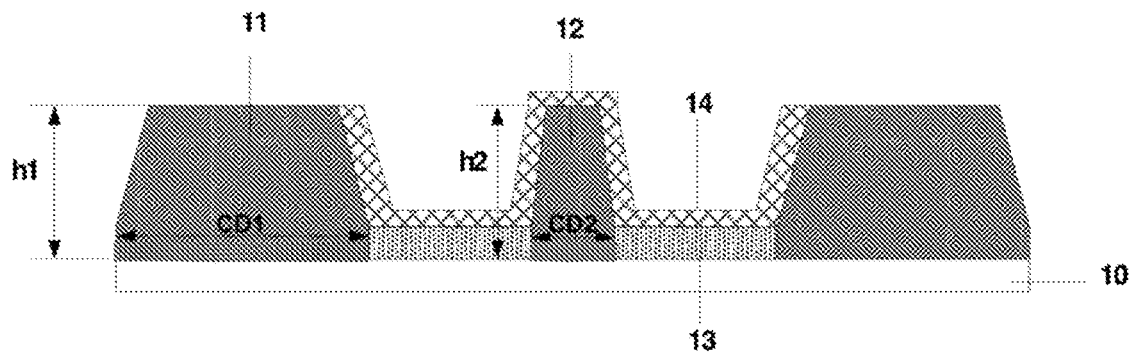
FIG. 4 is a cross-sectional view of a display substrate according to a third embodiment of the present disclosure.

It is noted that in other embodiments of the display substrate, such as in the embodiments shown in FIG. 3 and FIG. 4, the second pixel-defining portion 12 can be configured to have a smaller width than the first pixel-defining portion 11 (i.e. CD2<CD1), and to have a substantially same height than the first pixel-defining portion 11 (i.e. h2=h1). Other relative relationships are also possible.

According to some embodiments of the display substrate, the first pixel-defining portion 11 can be configured to have a width of larger than, or equal to, 10 μm, and a height of larger than, or equal to, 3 μm. The second pixel-defining portion 12 can have a width of 5-10 μm, and a height of 1-3 μm.

According to some embodiments, the display substrate can be an organic light-emitting diode display substrate. The display substrate can also be of other types.

Further with reference to FIG. 1 and FIG. 3, which respectively illustrate the first and second embodiment of the display substrate, the light-emitting layer 14 over any two neighboring sub-pixels of the same color are not connected to one another (i.e. separated from one another). Such a structure can effectively avoid the interference between the two neighboring sub-pixels of the same color.

In addition, during manufacturing of the light-emitting layer 14 through the evaporation deposition process, the light-emitting layers 14 in each of the two neighboring sub-pixels of the same color can be fabricated by the evaporation deposition process over different openings of a mask that respectively correspond to the two neighboring sub-pixels of the same color.

Figure 5:
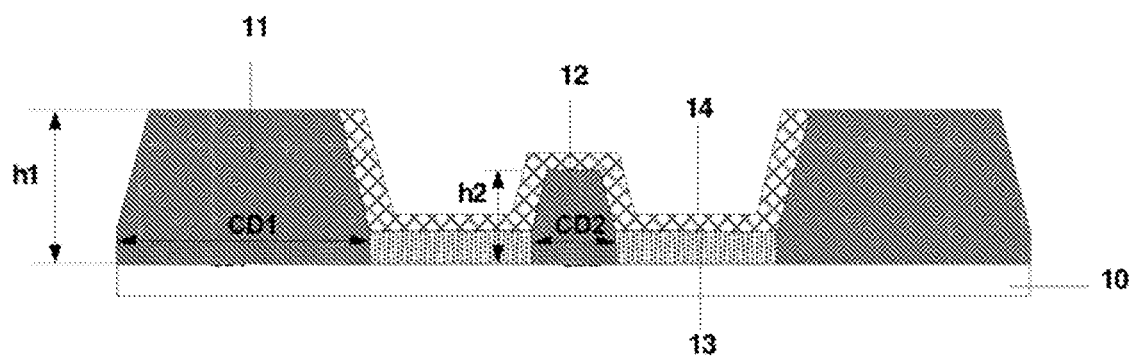
FIG. 5 is a cross-sectional view of a display substrate according to a fourth embodiment of the present disclosure.

Further with reference to FIG. 4 and FIG. 5, which respectively illustrate the third and fourth embodiment of the display substrate, the light-emitting layer 14 over the at least two neighboring sub-pixels of the same color are connected to one another. In other words, the light-emitting layer 14 has one portion thereof over the second pixel-defining portion 12 that is between two neighboring sub-pixels of the same color.

Because this above portion of the light-emitting layer 14 is relatively distant from an anode, it does not emit lights. Even though it may emit lights under weak currents, because it has a same color as other portions of the light-emitting layer 14, such as those over the neighboring sub-pixels of the same color, the lights emitted by the portion over the second pixel-defining portion 12 do not interfere with the lights emitted from the neighboring sub-pixels of the same color.

In addition, during manufacturing of the light-emitting layer 14 through the evaporation deposition process, the light-emitting layers 14 in each of the at least two neighboring sub-pixels of the same color can be fabricated by the evaporation deposition process over a same opening of a mask. As such, the opening of the mask for the evaporation deposition process can be configured to be relatively large, which can decrease the requirement for accuracy for the evaporation deposition mask, in turn resulting in a reduced manufacturing cost.

In any of the embodiments as described above, the neighboring sub-pixels of the same color can be arranged in an array (for example, in a column or a row of sub-pixels), and thus can have a number of 2 or more than 2.

As such, if the neighboring sub-pixels of the same color have a number of 2, the light-emitting layer over each of the two neighboring sub-pixels of the same color can be connected to one another (such as the third and fourth embodiments as illustrated in FIG. 4 and FIG. 5) or separated from one another (such as the first and second embodiments as illustrated in FIG. 1 and FIG. 3).

If the neighboring sub-pixels of the same color have a number of more than 2, such as in embodiments where a same column/row of sub-pixels have a same color, the light-emitting layer for each of the same column/row of sub-pixels can be connected to one another, or separated from one another.

In a second aspect, the present disclosure further provides a method for manufacturing a display substrate. In any of the embodiments as described above, the display substrate can be an organic light-emitting display substrate, and can also be of other types.

The method includes the following steps: S101-S102 according to some embodiments of the disclosure.

S101: Forming a pixel-defining layer comprising a first pixel-defining portion and a second pixel-defining portion, wherein the second pixel-defining portion has a width smaller than a width of the first pixel-defining portion;

S102: Forming a plurality of sub-pixels of N colors in the sub-pixel regions defined by the pixel-defining layer, wherein the first pixel-defining portion is configured to separate neighboring sub-pixels of different colors, and the second pixel-defining portion is configured to separate neighboring sub-pixels of a same color, where N is an integer of more than 1.

In the above embodiments of the method for manufacturing a display substrate, each of the plurality of sub-pixels includes an anode, a light-emitting layer, and a cathode, and the color of a sub-pixel is defined as the color of lights emitted by the light-emitting layer in the sub-pixel.

According to some embodiments of the display substrate, the first pixel-defining portion can be configured to have a width of larger than, or equal to, 10 µm, and a height of larger than, or equal to, 3 µm. The second pixel-defining portion can have a width of 5-10 µm, and a height of 1-3 µm.

Optionally, the display substrate can include red sub-pixels (R), green sub-pixels (G), and blue sub-pixels (B), and as such, N is 3. It is noted that in other embodiments of the display substrate, the sub-pixels are not limited to the three primary colors (R, G, and B), and can have other colors, and additionally, N can be a number other than 3.

In the disclosure, a width of the pixel-defining layer is defined as a width between neighboring sub-pixel regions. A width of the second pixel-defining portion is smaller than a width of the first pixel-defining portion is referred to as a comparison of the width of the second pixel-defining portion and the width of the first pixel-defining portion in a substantially same direction.

In the embodiment of the display substrate described above, pixel-defining layers (i.e. the first pixel-defining portion and the second pixel-defining portion) having different widths are configured. Specifically, the first pixel-defining portion having a relatively larger width is configured to separate neighboring sub-pixels of different colors, whereas the second pixel-defining portion having a relatively smaller width is configured to separate neighboring sub-pixels of a same color. As such, the size of the second pixel-defining portion is reduced, which in turn can reduce the space taken up by the pixel-defining layer in the array substrate, sparing more space for arranging more sub-pixels or for arranging more driving circuit elements.

According to some embodiments of the method, the step of forming a pixel-defining layer comprising a first pixel-defining portion and a second pixel-defining portion (i.e. S101) comprises:

Performing an exposure process utilizing a halftone or gray mask to form the first pixel-defining portion and the second pixel-defining portion, such that the second pixel-defining portion has a smaller height than the first pixel-defining portion.

In other words, the first pixel-defining portion and second pixel-defining portion having different heights can be formed through a one-time patterning process (i.e. a patterning process utilizing a single mask), which can save the mask to be used, resulting in a reduced manufacturing cost.

According to some embodiments of the method, the step of forming a plurality of sub-pixels of N colors in the sub-pixel regions defined by the pixel-defining layer (i.e. S102) comprises the following sub-steps:

S1021: providing an evaporation deposition mask comprising a plurality of openings, wherein at least two neighboring sub-pixels of a same color correspond to one of the plurality of openings;

S1022: performing an evaporation deposition process utilizing the evaporation deposition mask to form a light-emitting layer, wherein the light-emitting layer of each of the at least two neighboring sub-pixels of the same color are connected.

In the above embodiments of the display substrate manufacturing method, during the light-emitting layer manufacturing process, the light-emitting layer of at least two neighboring sub-pixels of the same color can be formed over a same opening of the evaporation deposition mask. As such the openings of the evaporation deposition mask can be configured to be relatively large, which can decrease the requirement for accuracy for the evaporation deposition mask, in turn resulting in a reduced manufacturing cost.

In addition, the light-emitting layer of each of the at least two neighboring sub-pixels of the same color are connected to one another, or in other words, the light-emitting layer has one portion thereof over the second pixel-defining portion that is between two neighboring sub-pixels of the same color.

Because this above portion of the light-emitting layer is relatively distant from an anode, it does not emit lights. Even though it may emit lights under weak currents, because it has a same color as other portions of the light-emitting layer, such as those over the neighboring sub-pixels of the same color, the lights emitted by the portion over the second pixel-defining portion do not interfere with the lights emitted from the neighboring sub-pixels of the same color.

According to some other embodiments of the method, the step of the step of forming a plurality of sub-pixels of N colors in the sub-pixel regions defined by the pixel-defining layer (i.e. S102) comprise the following sub-steps:

S1021': providing an evaporation deposition mask comprising a plurality of openings, wherein neighboring sub-pixels of a same color correspond to different openings;

S1022': performing an evaporation deposition process utilizing the evaporation deposition mask to form a light-emitting layer, wherein the light-emitting layer of each of neighboring sub-pixels of a same color are not connected.

In the above embodiments of the display substrate manufacturing method, during the light-emitting layer manufacturing process, the light-emitting layer of neighboring sub-pixels of the same color are formed over different openings of the evaporation deposition mask. As such, the light-emitting layer of each of neighboring sub-pixels of a same color are not connected, which can effectively avoid the interference between neighboring sub-pixels of a same color.

In a third aspect, the present disclosure further provides an organic light-emitting display apparatus, which includes a display substrate according to any of the embodiments as described above.

Unless otherwise defined, the technical terms or scientific terms used in the present disclosure are of their respectively common meaning understandable to people of ordinary skills in the field. The terms "first", "second", and alike, as used in the disclosure, are purported to only distinguish different components or steps, and thus do not represent any order, quantity, or importance. Similarly, the terms such as "a", "an", "one", or alike, as used in the disclosure, do not denote quantity restriction, but only express the quantity of "at least one."

The terms such as "connect", "connected", or "connection", are not limited to physical or mechanical connections, but can include electrical connections, regardless of being direct or indirect connections. The terms "over", "on", "below", "under", if any, are used only to represent relative position relations. When the absolute position of the described object is changed, the relative position relationship is also changed accordingly.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A display substrate, comprising:
   a substrate;
   a pixel-defining layer configured to define a plurality of sub-pixel regions; and
   a plurality of sub-pixels having at least two colors, each arranged within each of the plurality of sub-pixel regions;
   wherein:
      the pixel-defining layer and the plurality of sub-pixels are disposed over the substrate; and
      the pixel-defining layer comprises:
         a plurality of first pixel-defining portions, each configured to separate neighboring sub-pixels of different colors; and
         a plurality of second pixel-defining portions, each of the plurality of second pixel-defining portions is configured to separate neighboring sub-pixels of the same color;
         wherein:
            at least one of the plurality of second pixel-defining portions has a smaller width than any one of the plurality of first pixel-defining portions; and
            each of the plurality of second pixel-defining portions has a smaller height than each of the plurality of first pixel-defining portions.

2. The display substrate of claim 1, wherein each of the plurality of second pixel-defining portions has a smaller width than each of the plurality of first pixel-defining portions.

3. The display substrate of claim 2, wherein:
   each of the plurality of first pixel-defining portions has a width of larger than, or substantially equal to, 10 μm; and
   each of the plurality of second pixel-defining portions has a width having a range of approximately 5-10 μm.

4. The display substrate of claim 1, wherein:
   each of the plurality of first pixel-defining portions has a height larger than 3 μm; and
   each of the plurality of second pixel-defining portions has a height having a range of approximately 1-3 μm.

5. The display substrate of claim 1, wherein each of the plurality of second pixel-defining portions has a substantially same height as each of the plurality of first pixel-defining portions.

6. The display substrate of claim 1, wherein the display substrate is an organic light-emitting diode display substrate.

7. The display substrate of claim 6, wherein each of any two neighboring sub-pixels having a same color contains a light-emitting layer that is not connected to one another.

8. The display substrate of claim 6, wherein each of at least two neighboring sub-pixels having a same color contains a light-emitting layer that is connected to one another.

9. A method for manufacturing a display substrate, comprising:
   providing a substrate;
   forming a pixel-defining layer comprising a plurality of first pixel-defining portions and a plurality of second pixel-defining portions over the substrate, wherein the pixel-defining layer define a plurality of sub-pixel regions, and at least one of the plurality of second pixel-defining portions has a smaller width than any one of the plurality of first pixel-defining portions; and
   forming a plurality of sub-pixels over the substrate, such that each of the plurality of sub-pixels is arranged in in each of the plurality of sub-pixel regions, any two neighboring sub-pixels of different colors are separated by one of the plurality of first pixel-defining portions, and any two neighboring sub-pixels of a same color are separated by one of the plurality of second pixel-defining;
   wherein the forming a plurality of sub-pixels over the substrate comprises:
      providing an evaporation deposition mask comprising a plurality of openings, configured such that at least two neighboring sub-pixels of a same color correspond to one of the plurality of openings; and
      performing an evaporation deposition process utilizing the evaporation deposition mask to form a light-emitting layer, such that the light-emitting layer of each of the at least two neighboring sub-pixels of the same color are connected.

10. The method of claim 9, wherein in the forming a pixel-defining layer comprising a plurality of first pixel-defining portions and a plurality of second pixel-defining portions over the substrate, each of the plurality of second pixel-defining portions has a smaller width than each of the plurality of first pixel-defining portions.

11. The method of claim 10, wherein in the forming a pixel-defining layer comprising a plurality of first pixel-defining portions and a plurality of second pixel-defining portions over the substrate:
   each of the plurality of first pixel-defining portions has a width of larger than, or substantially equal to, 10 μm; and
   each of the plurality of second pixel-defining portions has a width having a range of approximately 5-10 μm.

12. A method for manufacturing a display substrate, comprising:
   providing a substrate;
   forming a pixel-defining layer comprising a plurality of first pixel-defining portions and a plurality of second pixel-defining portions over the substrate, wherein the pixel-defining layer define a plurality of sub-pixel regions, and at least one of the plurality of second pixel-defining portions has a smaller width than any one of the plurality of first pixel-defining portions; and
   forming a plurality of sub-pixels over the substrate, such that each of the plurality of sub-pixels is arranged in in each of the plurality of sub-pixel regions, any two neighboring sub-pixels of different colors are separated by one of the plurality of first pixel-defining portions, and any two neighboring sub-pixels of a same color are separated by one of the plurality of second pixel-defining;
   wherein:
      in the forming a pixel-defining layer comprising a plurality of first pixel-defining portions and a plurality of second pixel-defining portions over the substrate, each of the plurality of second pixel-defining portions has a smaller width than each of the plurality of first pixel-defining portion;

in the forming a pixel-defining layer comprising a plurality of first pixel-defining portions and a plurality of second pixel-defining portions over the substrate:
each of the plurality of first pixel-defining portions has a width of larger than, or substantially equal to, 10 μm; and
each of the plurality of second pixel-defining portions has a width having a range of approximately 5-10 μm; and
the forming a pixel-defining layer comprising a plurality of first pixel-defining portions and a plurality of second pixel-defining portions over the substrate comprises:
performing an exposure process utilizing a halftone or gray mask to form the plurality of first pixel-defining portions and the plurality of second pixel-defining portions, such that each of the plurality of second pixel-defining portions has a smaller height than each of the first pixel-defining portion.

13. The method of claim 12, wherein:
each of the plurality of first pixel-defining portions has a height of larger than, or substantially equal to, 3 μm; and
each of the plurality of second pixel-defining portions has a height having a range of approximately 1-3 μm.

14. The method of claim 11, wherein the forming a pixel-defining layer comprising a plurality of first pixel-defining portions and a plurality of second pixel-defining portions over the substrate comprises:
performing an exposure process utilizing a mask to form the plurality of first pixel-defining portions and the plurality of second pixel-defining portions, such that each of the plurality of second pixel-defining portions has a substantially same height than each of the first pixel-defining portion.

15. The method of claim 9, wherein the forming a plurality of sub-pixels over the substrate comprises:
providing an evaporation deposition mask comprising a plurality of openings, configured such that neighboring sub-pixels of a same color correspond to different openings; and
performing an evaporation deposition process utilizing the evaporation deposition mask to form a light-emitting layer, such that the light-emitting layer of each of neighboring sub-pixels of a same color are not connected.

16. The method of claim 9, wherein the light-emitting layer is an organic light-emitting layer.

17. A display apparatus, comprising a display substrate according to claim 1.

18. The display apparatus according to claim 17, wherein the display substrate is an organic light-emitting diode display substrate.

* * * * *